United States Patent
Dunne et al.

(10) Patent No.: US 8,313,982 B2
(45) Date of Patent: Nov. 20, 2012

(54) STACKED DIE ASSEMBLIES INCLUDING TSV DIE

(75) Inventors: Rajiv Dunne, Murphy, TX (US); Margaret Rose Simmons-Matthews, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 53 days.

(21) Appl. No.: 12/885,874

(22) Filed: Sep. 20, 2010

(65) Prior Publication Data

US 2012/0070939 A1 Mar. 22, 2012

(51) Int. Cl.
*H01L 21/70* (2006.01)

(52) U.S. Cl. ........ 438/110; 438/106; 438/107; 438/108; 438/112; 438/113; 257/621; 257/686; 257/689; 257/777; 257/E21.499; 257/E21.502; 257/E21.503; 257/E21.511

(58) Field of Classification Search .................. 257/621, 257/686, 689, 777, E21.499, E21.511, E21.502, 257/E21.503; 438/106, 107, 108, 110, 112, 438/113
See application file for complete search history.

(56) References Cited

U.S. PATENT DOCUMENTS

| | | | |
|---|---|---|---|
| 6,620,651 B2 | 9/2003 | He et al. | |
| 7,534,722 B2 | 5/2009 | Trezza | |
| 7,973,416 B2 | 7/2011 | Chauhan | |
| 2006/0001174 A1 | 1/2006 | Matsui | |
| 2006/0131721 A1* | 6/2006 | Ito ................................. | 257/689 |
| 2008/0090085 A1* | 4/2008 | Kawate et al. ................ | 428/413 |
| 2009/0280602 A1 | 11/2009 | Bonifield et al. | |
| 2009/0294028 A1 | 12/2009 | Heck et al. | |
| 2010/0013081 A1 | 1/2010 | Toh et al. | |
| 2010/0159643 A1 | 6/2010 | Takahashi et al. | |

\* cited by examiner

*Primary Examiner* — Peniel M Gumedzoe
(74) *Attorney, Agent, or Firm* — Steven A. Shaw; W. James Brady; Frederick J. Telecky, Jr.

(57) ABSTRACT

A method of through substrate via (TSV) die assembly includes positioning a plurality of TSV die with their topside facing down onto a curable bonding adhesive layer on a carrier. The plurality of TSV die include contactable TSVs that include or are coupled to bondable bottomside features protruding from its bottomside. The curable bonding adhesive layer is cured after the positioning. A plurality of second IC die each having a plurality of second bonding features are bonded onto the plurality of TSV die to form a plurality of stacked die assemblies on the carrier. Debonding after the bonding separates the carrier from the plurality of stacked die assemblies. The plurality of stacked die assemblies are then singulated to form a plurality of singulated stacked die assemblies.

17 Claims, 6 Drawing Sheets

STACKED DIE ASSEMBLIES INCLUDING TSV DIE

FIELD

Disclosed embodiments relate to stacked die assemblies that include at least one through substrate via (TSV) die.

BACKGROUND

The standard assembly sequence for stacked die assemblies when one die is a singulated TSV die with protruding TSV tips on its bottomside and bonding features (e.g., pillars with solder caps) on its topside is generally one of two methods which each involve thermo-compression (TC) bonding. As known in the art, TC bonding involves heating a heated workholder which holds the part being bonded to while applying a compressive force in a bond head contact zone. For example, typical TC bonding conditions can comprise a time of 5 to 10 seconds, a temperature of 150 to 300° C., and a compressive force of ~1-2 gram force (gf)/bump, which for 500 bumps with 2 gf/bump equals a 1,000 gf total force (=10 N).

A first conventional stacked die assembly method including TSV die involves optionally attaching a package substrate to carrier wafer, flip chip attaching a singulated TSV die having protruding and exposed TSV tips on the bottomside of the TSV die to the package substrate so that the TSV tips face up, and then attaching a singulated second die to the exposed TSV tips. This approach places the exposed TSV tips in the bond head contact zone where bond head force is applied directly to the TSV tips during TC attachment of the TSV die to the package substrate. As a result, the TSV tips, TSVs, and/or the surrounding low-k dielectric layers may be damaged by the applied pressure and/or heat during this TC attachment step.

A second conventional stacked die assembly method including TSV die involves TC bonding for attaching a singulated TSV die having TSV tips on the bottomside of the TSV die face-up to a second die that is in wafer form. In this approach the bonding features (e.g., pillars with solder caps) on the topside of the TSV die are in the bond head contact zone and thus directly receive the bonding head force. As a result, the bonding features (e.g., pillars with solder caps) on the topside and/or the surrounding low-k dielectric layers may be damaged by pressure and/or heat during the TC attachment.

Accordingly, conventional TC attachment of singulated TSV die having TSV tips in a die-to-die or die-to-wafer assembly process has a tendency to damage the bonding terminals features (e.g., pillars with solder caps), the TSV tips, the TSVs themselves and/or adjacent layers (e.g., low-k dielectrics) on the TSV die during the assembly process. Such damage can significantly reduce yield for stacked die devices and also lead to reliability failures in the field. What is needed is new assembly sequences for attaching singulated TSV die having bondable protruding features in a die-to-die or die-to-wafer assembly process which minimizes or eliminates this damage.

SUMMARY

Disclosed embodiment include assembly processes for forming stacked die assemblies where TSV die having contactable TSVs that include bondable bottomside features protruding from its bottomside (TSV tips or pillars) and bonding features (e.g., pillars with solder caps) on its topside are first positioned face down unto a curable adhesive bonding layer on a carrier. The TSV die each include a plurality of TSVs that extend from its topside to contactable TSVs on its bottomside.

The positioning step is a gentle temporary placement of the TSV die topside down which protects the bondable bottomside features protruding from its bottomside that is enabled by the curable (soft/compliant) adhesive bonding layer on a carrier. The soft adhesive bonding layer allows use of low pressure positioning, such pick and place. The Inventors have recognized that low pressure positioning avoids damage to the TSV tips/terminal pads and low-k dielectric layers, while the bonding adhesive provides a flat surface for later bonding at least one IC die thereon.

As known in the art and defined herein, pick and place comprises vacuum pickup and vacuum release for die drop, where during the placement process, components are picked from a tape generally by means of a vacuum pickup. The IC die are then automatically aligned and oriented by the machine before placing in position on a substrate. Pick and place uses a significantly lower force on the bondable bottomside features protruding from the bottomside of the TSV die (protruding TSV tip or pillar) that face up during assembly as compared to conventional TC bonding, and pick and place does not require heating/added temperature.

The positioning can also comprise a modified TC bonding process that uses a TC bond head operated at a reduced pressure $\leq 1$ N, and a reduced temperature $\leq 100°$ C. In one embodiment the TC bond head includes a compliant material thereon. Positioning is then followed by at least partially curing the curable adhesive, and chip stacking to form stacked die assemblies where second IC die are bonded to the TSV die, an optional mold step, debond/release of the stacked die assemblies from the carrier, and then singulation. The stacked die assemblies in one embodiment are assembled to a package substrate using a standard flip-chip process.

DETAILED DESCRIPTION

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 1:
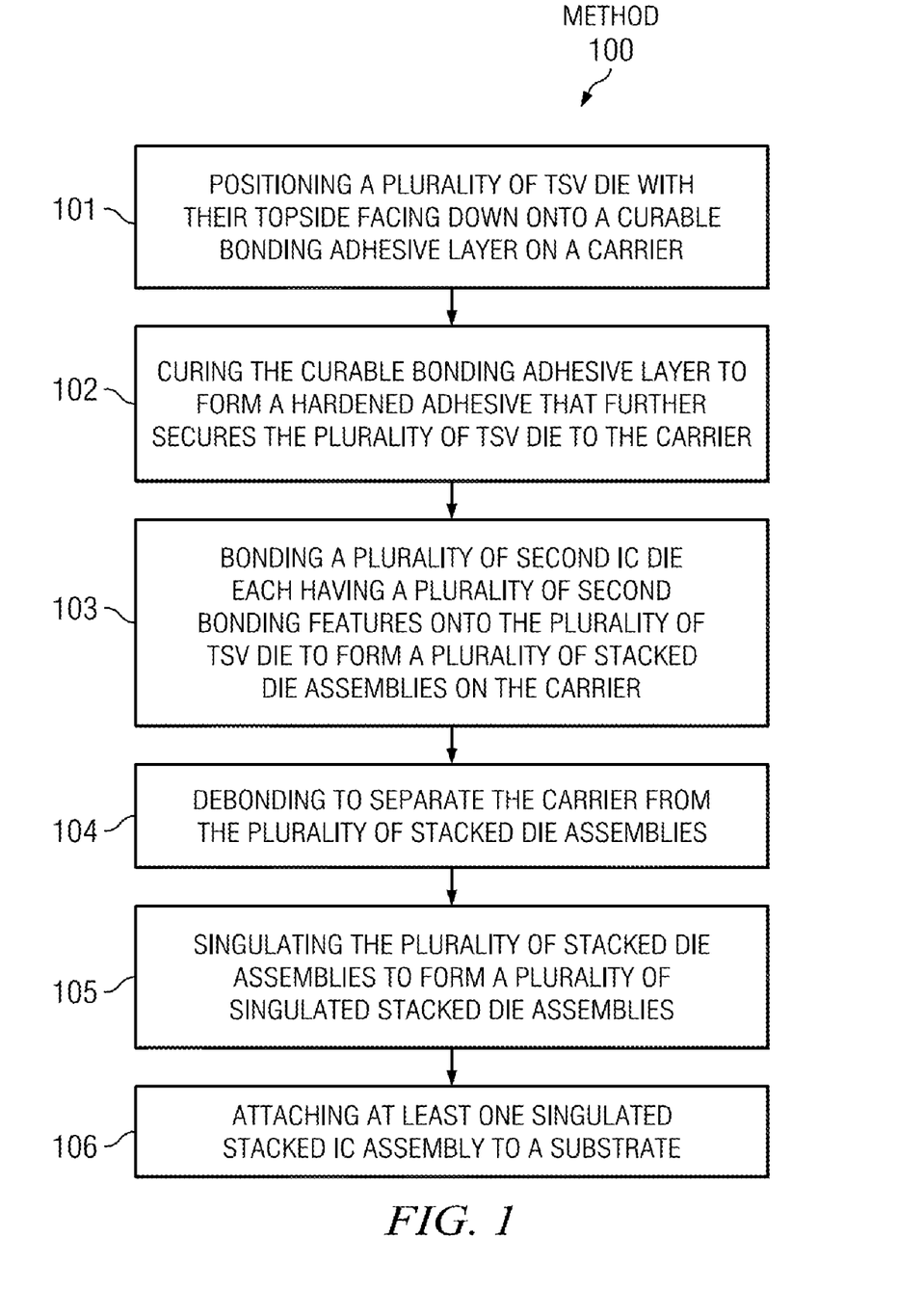
FIG. 1 is a flow chart that shows steps in an exemplary method for forming a stacked die assembly that includes at least one TSV die having a plurality of TSVs, according to a disclosed embodiment.

FIG. 1 is a flow chart that shows steps in an exemplary method 100 for stacked die assembly including TSV die, according to a disclosed embodiment. Disclosed embodiments include assembly of singulated TSV die to singulated second IC die (singulated TSV die-to-singulated second IC die), assembly of singulated TSV die and a wafer comprising second IC die (singulated TSV die-to-wafer of second IC die), and assembly of a TSV wafer including TSV die and singulated second IC die (wafer of TSV die-to-singulated second IC die).

Step 101 comprises positioning a plurality of TSV die with their topside facing down onto a curable bonding adhesive layer on a carrier. The curable bonding adhesive layer can comprise a B-stage resin which as known in polymer science is a material in which a limited reaction between resin and hardener (catalyst) has been allowed to take place, and the reaction is arrested while the product is still fusible and soluble, having a higher softening point and a more limited solubility than the resin prior to the limited reaction. A B-stage resin contains sufficient hardener to effect curing upon subsequent heating. In one embodiment the B-stage resin comprises an epoxy resin.

The carrier is commonly referred to in the art as a "wafer carrier" can comprise materials including quartz or silicon, for example. The TSV die includes electrically contactable TSVs that include or are coupled to bondable bottomside features protruding from its bottomside. The TSV die or TSV wafer comprising a plurality of TSV die is generally a thinned die or wafer, typically from 25 μm to 150 μm thick.

In one embodiment the bondable bottomside features comprise protruding TSV tips that comprise the TSV metal filler integrally extending out from the bottomside of the TSV die. In another embodiment the bondable bottomside features comprise pillars coupled to the contactable TSVs, such as substantially flush TSVs coupled to a redirect layer (RDL) that is coupled to solder capped pillars. The TSV tips or pillars are generally 5 to 15 μm long and are generally 10 to 30 μm in linear dimension (e.g., diameter).

The adhesive bonding layer can be applied using a spin-coating or a lamination process. The adhesive bonding layer in a typical embodiment is from 70 to 100 μm thick. In one embodiment the adhesive bonding layer comprises WAFER-BOND™ HT-10.10 adhesive from Brewer Science, Inc. Rolla, Mo. WAFERBOND™, which can be spun-on. Other exemplary adhesive bonding layers that can be used include UV-curing liquid adhesives. In one embodiment the curable bonding adhesive layer comprises a bi-layer bonding adhesive arrangement having a more compliant top bonding adhesive layer on a less compliant bottom bonding adhesive layer. In this embodiment, the less compliant bottom adhesive layer can be fully cured.

The positioning can comprise pick and placing the plurality of TSV die with their topside facing down onto an uncured bonding adhesive layer to temporarily attach the plurality of TSV die to the carrier wafer. The typical force applied by the bonding head is generally <1-2 N. The bond head temperature can be room temperature, and is generally ≦100° C.

Alternatively, the positioning can comprise using a TC bond head at a pressure <1 N, at a temperature ≦100° C. In this embodiment the bond head pressure will typically be in the range from 0.5-1 N. It is noted that this bond head pressure is significantly lower as compared to the >5 N bond head pressure typically required for conventional TC bonding (e.g., 1 gram force (gf)/bump×500 bumps/die=500 gf/die=5 N). In this embodiment the temperature can be from room temperature to ≦100° C., with the temperature used depending on the bonding approach and the material properties of the bonding adhesive layer. In one example, the bond head is heated and the bonding adhesive layer thereon is at room temperature. In another example, the bond head is at room temperature and the carrier and its bonding adhesive layer are heated to a temperature between 40° C. and 100° C. The TC bond head can include a compliant material thereon to protect the exposed bondable bottomside features (e.g., TSV tips or pillars).

In one embodiment, for the positioning step, the topside of the carrier can include one or more alignment features to align with each TSV die to aid in the accuracy of the positioning. In this embodiment the adhesive is optically clear. Automated placement of the TSV die on the adhesive coated carrier in this embodiment can be done by stepping in an x and/or y direction by a specific distance while searching for the alignment features.

Step 102 comprises curing the curable bonding adhesive layer after positioning. Curing can be thermal or UV-based processes, which functions to cure the curable bonding adhesive layer to form a hardened adhesive that further secures the plurality of TSV die to the carrier.

Step 103 comprises bonding a plurality of second IC die each having a plurality of second bonding features onto the plurality of TSV die to form a plurality of stacked die assemblies on the carrier. The bonding can comprises TC bonding. Other example bonding techniques that can be used include thermosonic (e.g., temperature, pressure, vibration) and mass reflow (e.g., dip in flux, pick and place, reflow in a convection oven).

Step 104 comprises debonding after bonding (step 103) to separate the carrier from the plurality of stacked die assemblies. The debonding can comprises heat release, UV release or solvent release. UV or solvent release can minimize damage to the bonding features protruding from the frontside of the TSV die, such as Cu pillar solder cap bumps. With a UV-curing adhesive is possible to remove from the carrier by laser exposing to form small bubbles on the boundary to the glass or other carrier material, and then the adhesive residue can be removed from the carrier by a removal tape.

In one embodiment the plurality of second IC die comprise a plurality of singulated second IC die. In this embodiment the method can include adding a mold material between the plurality of singulated second IC die to form a molded wafer before debonding.

Step 105 comprises singulating the plurality of stacked die assemblies to form a plurality of singulated stacked die assemblies. Step 106 comprises attaching at least one singulated stacked IC assembly to a substrate. In a typical embodiment, the substrate is a package substrate, such as a multilayer (ML) printed circuit board (PCB) substrate. The substrate more generally can comprise an organic substrate, ceramic substrate, Si substrate, or Si interposer.

Figure 2A:
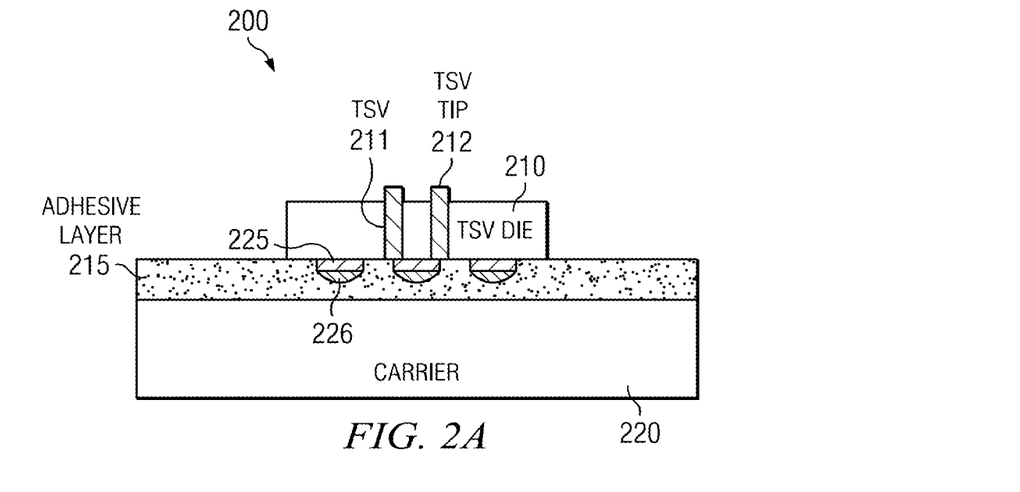
FIG. 2A is a side view depiction of a TSV die after being positioned topside facing down onto an curable bonding adhesive layer on a carrier, where the TSV die includes TSVs including protruding TSV tips, according to a disclosed embodiment.

FIG. 2A is a side view depiction 200 of a TSV die 210 after being positioned topside down onto an curable bonding adhesive layer 215 on a carrier 220, according to a disclosed embodiment. The TSV die 210 includes TSVs 211 that are shown including protruding TSV tips 212. TSVs 211 are shown in simplified form lacking an outer dielectric liner and metal barrier layer within the liner that is generally used when the TSV metal comprises metals such as copper. As noted above the adhesive bonding layer 215 in a typical embodiment is from 70 to 100 μm thick. However, the thickness of the adhesive bonding layer 215 can be more or less than 70 to 100 μm thick. The topside of the TSV die 210 is shown including metal (e.g., copper) pillars 225 having solder caps 226 which after positioning are embedded in the curable bonding adhesive layer 215.

Figure 2B:
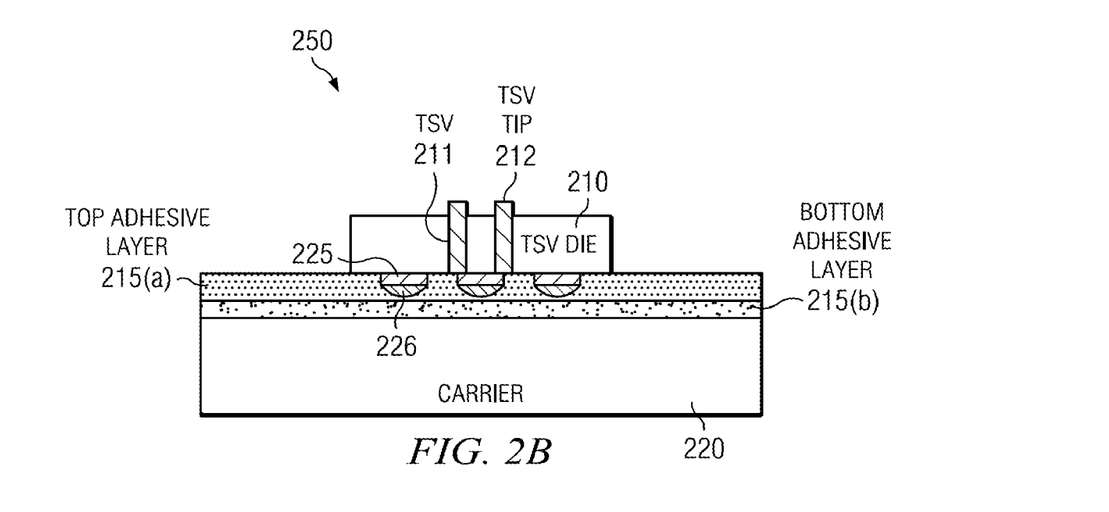
FIG. 2B is a side view depiction of a TSV die after being positioned topside facing down onto an curable bonding adhesive layer on a carrier, where the TSV die includes TSVs including protruding TSV tips, and the bonding adhesive layer comprises a bi-layer bonding adhesive having a more compliant top adhesive layer on a less compliant bottom adhesive layer, according to another disclosed embodiment.

FIG. 2B is a side view depiction 250 of a TSV die 210 after being positioned topside facing down onto an curable bonding adhesive layer on a carrier, where the bonding adhesive layer comprises a bi-layer bonding adhesive arrangement having a more compliant top bonding adhesive layer 215(a) on a less compliant bottom adhesive layer 215(b), according to another disclosed embodiment. The bi-layer bonding adhesive arrangement shown helps avoid flattening/damage of the solder caps/bumps 226 or other bonding connectors on the frontside of the TSV die 210 to the carrier 220 during the positioning step. The bi-layer can comprise two (2) different materials or be formed by applying the same adhesive material two (2) separate times, where in one embodiment the bottom adhesive layer 215(b) is fully cured and the top adhesive layer 215(a) is in the B-stage to enable attachment of the TSV die 210.

Figure 3A:
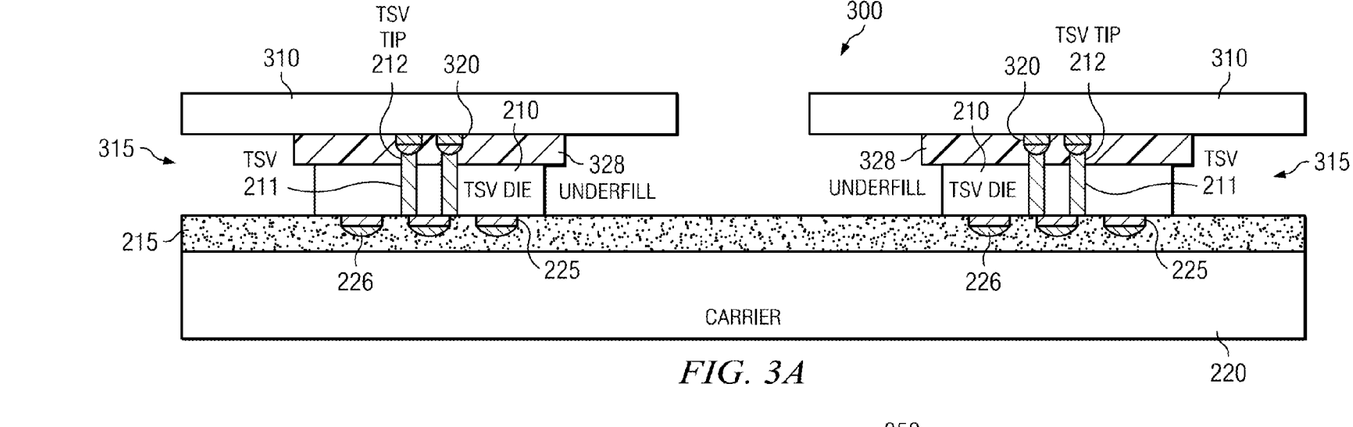
FIG. 3A is a side view depiction of a plurality of stacked die assemblies comprising singulated second IC die having a plurality of second bonding features on TSV die on a carrier, according to a disclosed embodiment.

FIG. 3A is a side view depiction 300 of a plurality of stacked die assemblies 315 comprising singulated second IC die 310 having a plurality of second bonding features 320 on a TSV die 210 on a carrier 220, according to a disclosed embodiment. The TSV die 210 is positioned topside facing down onto a curable bonding adhesive layer 215 on the carrier 220. An underfill layer 328 is shown on the bonding features 320 of second IC die 310. Underfill layer 328 serves as a gap filler for the region between the TSV die 210 and second IC die 310, which is helpful for the microbump interconnect (e.g., TSV-to-Cu pillar) and overall package reliability.

Depiction 300 represents the structure after the bonding of singulated second IC die 310 having a plurality of second bonding features onto the TSV die 210 to form a plurality of stacked die assemblies on the carrier. Bonding step 103 is described above relative to method 100, where in step 102 the curable bonding adhesive layer is cured after positioning to form a hardened bonding adhesive 215 that further secures the plurality of TSV die 210 to the carrier 220. The area of second IC die 310 can be seen to be larger as compared to the area of the TSV die 210.

Figure 3B:
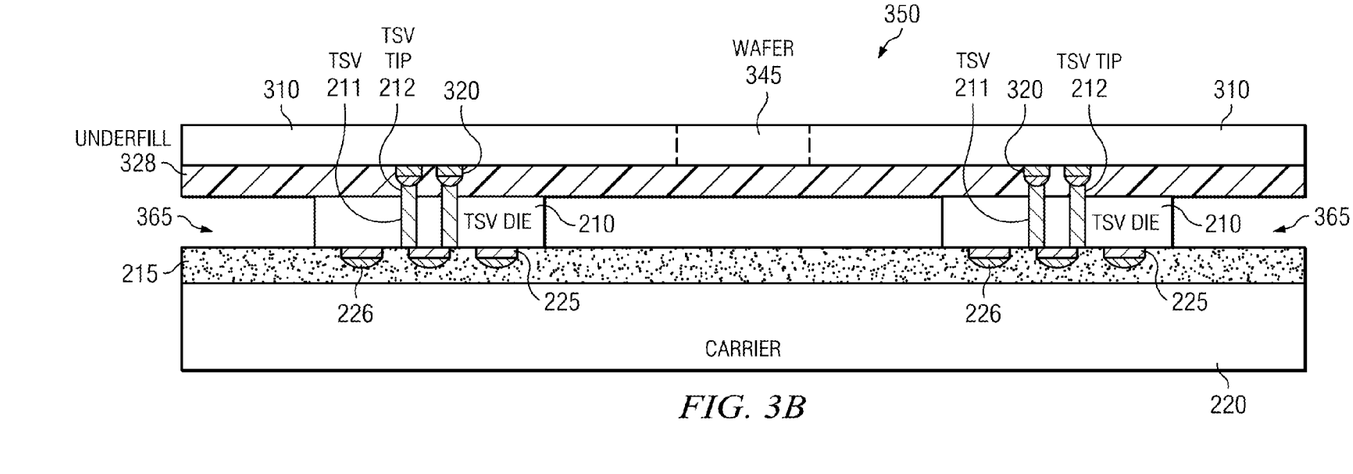
FIG. 3B is a side view depiction of a plurality of stacked die assemblies comprising a wafer comprising a plurality of second IC die having a plurality of second bonding features on TSV die on a carrier, according to a disclosed embodiment.

FIG. 3B is a side view depiction 350 of a plurality of stacked die assemblies 365 comprising a wafer 345 comprising a plurality of second IC die 310 having a plurality of second bonding features 320 on a TSV die 210 on a carrier 220, according to a disclosed embodiment. The TSV die 210 is positioned topside facing down onto a curable bonding adhesive layer 215 on the carrier 220. Depiction 350 represents the structure after the bonding (step 103 described relative to method 100) of a wafer 345 comprising a plurality of second IC die 310 having a plurality of second bonding features 320 onto the TSV die 210 to form a plurality of stacked die assemblies 365 on the carrier 220. As described above relative to step 104 in method 100, the plurality of stacked die assemblies 315 and 365 shown in FIGS. 3A and 3B, respectively, are subsequently debonded from the carrier 220, and then singulated (step 105).

Figure 4A:
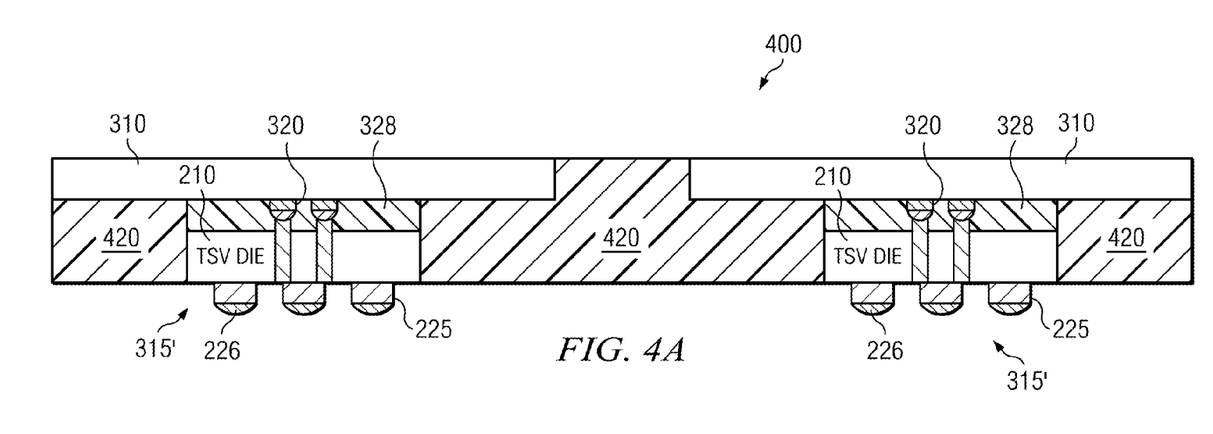
FIG. 4A is a side view depiction of a molded wafer comprising stacked die assemblies comprising singulated second IC die having a plurality of second bonding features on TSV die, including a mold material that holds the stacked die assemblies, according to a disclosed embodiment.
Figure 4B:
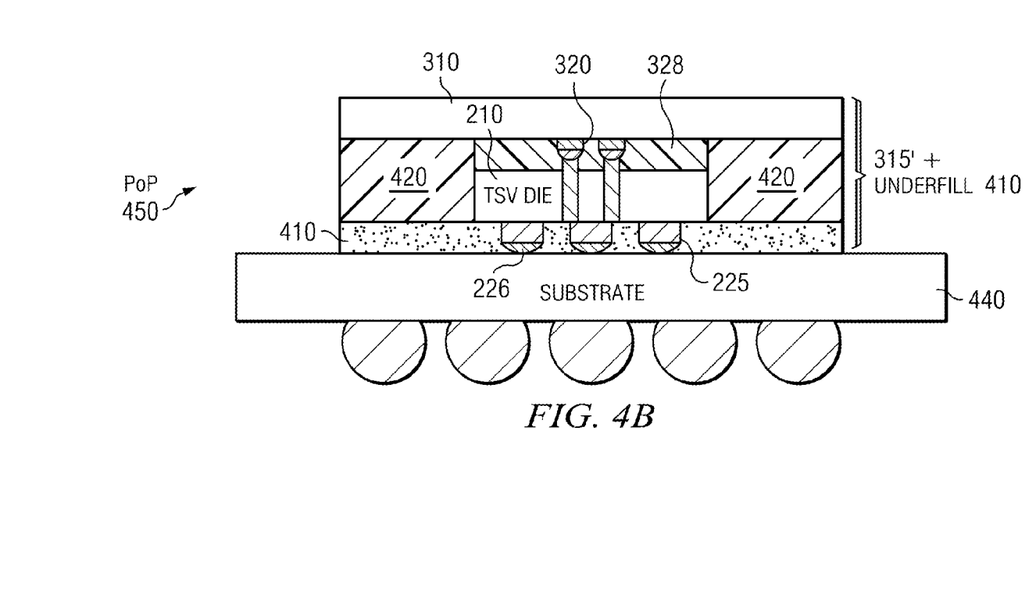
FIG. 4B is a side view depiction of a Package-On-Package (PoP) assembly comprising a molded stack die assembly obtained from singulating the molded wafer shown in FIG. 4A on a package substrate, according to a disclosed embodiment.

Mold material can be added before bebonding the carrier to form a molded wafer, such as for die-die embodiments. FIG. 4A is a side view depiction of a molded wafer 400 comprising molded stacked die assemblies 315' comprising singulated second IC die 310 having a plurality of second bonding features 320 on TSV die 210, including a mold material 420 that holds the stacked die assemblies 315', following debonding of the carrier, according to a disclosed embodiment. FIG. 4B is a side view depiction of a PoP assembly 450 comprising a molded stack die assembly 315' obtained from singulating the molded wafer 400 shown in FIG. 4A on a package substrate 440, according to a disclosed embodiment, with an added underfill layer 410 shown between TSV die 210 and the package substrate 440 for gap filling. Although not shown, instead of attaching the molded stack die assembly 315' onto package substrate 440 to realize PoP 450, molded stack die assembly 315' can be used as a chip scale package (CSP).

Embodiments of the invention also include die-to-die through mold via (TMV) PoP assembly. In an exemplary TMV-PoP flow sequence, a singulated TSV die is flip chip attached onto a carrier wafer, a singulated second IC die is attached to the TSV die, a mold step forms a molded wafer, debonding releases the molded wafer from the carrier. The molded wafer is then placed on a saw tape, and the molded wafer is then singulated.

Figure 5A:
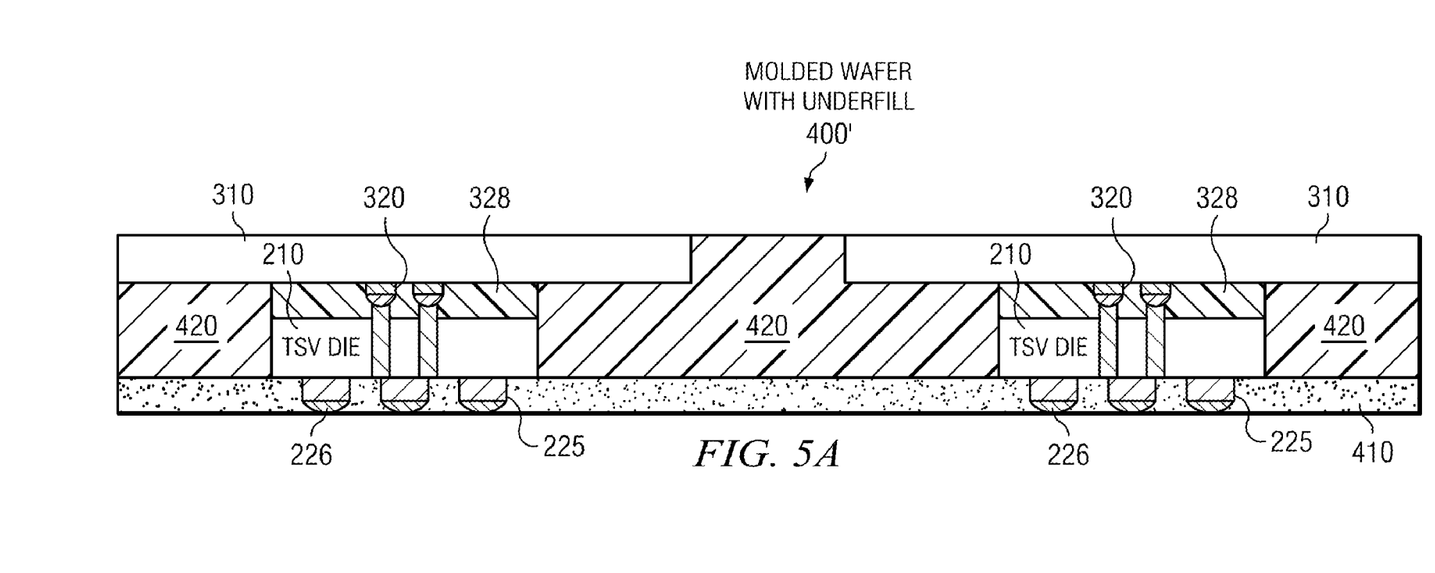
FIG. 5A is a side view depiction of a molded wafer comprising the molded wafer shown in FIG. 4A having an underfill layer thereon for gap filling between stacked die, according to a disclosed embodiment.

FIG. 5A is a side view depiction of a molded wafer 400' comprising the molded wafer 400 shown in FIG. 4A having an underfill layer 410 thereon for gap filling between stacked die, according to a disclosed embodiment. Analogous to the function for underfill layer 328 described above, underfill layer 410 serves as a gap filler for the region between the TSV die 210 and second IC die 310 for improved microbump interconnect and overall package reliability.

Underfill layer 410 may have a composition different from underfill layer 328. For example, because of the mismatch in CTE that can exist between TSV die 210 (e.g., silicon substrate) and conventional organic substrates, underfill layer 410 can include a higher filler (e.g., a dielectric filler such as silica) content to increase the Young's modulus (a measure of stiffness) and reduce the coefficient of thermal expansion (CTE), which can improve reliability. As the filler content is increased, the underfill becomes stiffer, and the CTE becomes less as well. This can be particularly helpful in the case of large CTE mismatches, such as the CTE mismatch between the TSV die (about 3 ppm/°C. in the case of a silicon die) and the substrate in the case of a conventional organic substrate (~15 ppm/C). Typical filler content in underfill layer 410 can be in the range of 50-60 wt. %.

Figure 5B:
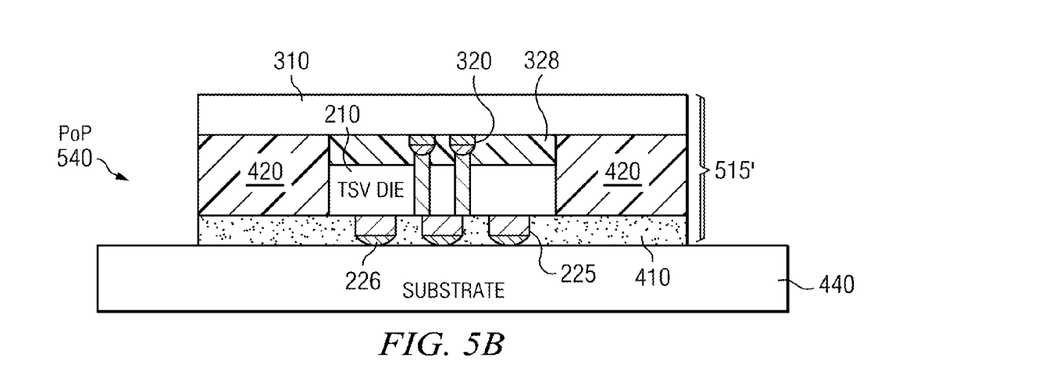
FIG. 5B is a side view depiction of a PoP assembly comprising a molded stack die assembly obtained from singulating the molded wafer shown in FIG. 5A attached to a package substrate, according to a disclosed embodiment.

FIG. 5B is a side view depiction of a PoP assembly 540 comprising a molded stack die assembly 515' obtained from singulating the molded wafer 400' shown in FIG. 5A attached to a package substrate 440, according to a disclosed embodiment.

Figure 5C:
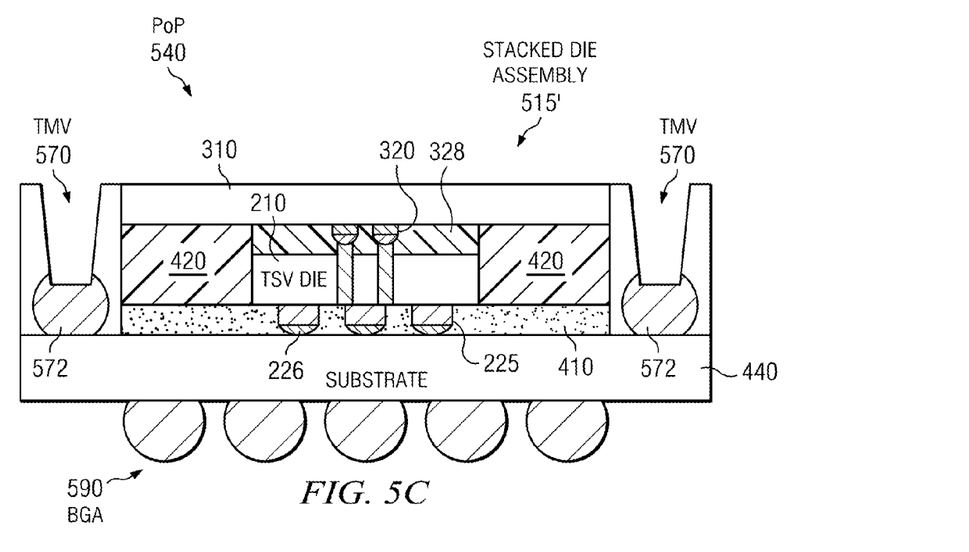
FIG. 5C is a side view depiction of a Through Mold Via (TMV)-PoP assembly comprising a molded stack die assembly obtained from singulating the molded wafer shown in FIG. 5A and attaching to a package substrate having TMVs, according to a disclosed embodiment.

FIG. 5C is a side view depiction of a TMV-PoP assembly 540 comprising a molded stack die assembly 515' obtained from singulating the molded wafer 400' shown in FIG. 5A and attaching to a package substrate 440 having TMVs 570, according to a disclosed embodiment. Regarding exemplary associated processing to form TMV-PoP assembly 540, after attaching the molded stack die assembly 515' to package substrate 440, electrically conductive TMV features 572 can be created for the PoP package. Solder balls can then be added to form a BGA 590, followed by singulation of the package substrate 440.

Advantages of disclosed embodiments include avoidance of damage to the TSV tips or pillars and low-K Si damage due to the force applied during standard TC bonding, and providing a flat surface particularly for die-to-die bonding. Accordingly, higher yielding processes can be obtained using disclosed embodiments for forming stacked die devices, particularly when the top IC die is larger in size as compared to the TSV die. Moreover, disclosed embodiments allow utilization of existing toolsets because the TSV die is essentially reconfigured on the carrier.

Although not disclosed above, disclosed embodiments can be extended to stacking additional die (3 or more die). Moreover, disclosed embodiments can be extended to enable highly integrated heterogenous chip integration (i.e., stacking of elements other than IC's, such as capacitors, resistors, etc.).

Disclosed embodiments can be integrated into a variety of assembly flows to form a variety of different IC devices and related products. The IC assembly can comprise single IC die or multiple IC die, such as PoP configurations comprising a plurality of stacked IC die. A variety of package substrates may be used. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can formed from a variety of processes including bipolar, CMOS, BiCMOS and MEMS.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

We claim:

1. A method of manufacturing through substrate via (TSV) die assembly, comprising:

positioning a plurality of TSV die with their topsides facing down onto a curable bonding adhesive layer on a carrier, said plurality of TSV die including contactable TSVs that include or are coupled to bondable bottomside features protruding from a bottomside of at least two TSV dies;

curing said curable bonding adhesive layer after said positioning;

bonding a plurality of second IC (intergrated circuit) die each having a plurality of second bonding features onto said plurality of TSV die to form a plurality of stacked die assemblies on said carrier;

debonding after said bonding to separate said carrier from said plurality of stacked die assemblies;

singulating said plurality of stacked die assemblies to form a plurality of singulated stacked die assemblies;

attaching said plurality of said singulated stacked die assemblies to a package substrate;

forming a mold layer on said package substrate lateral to said plurality of said singulated stacked die assemblies;

forming through mold vias including electrically conductive features lateral to said plurality of said singulated stacked die assemblies;

attaching solder balls on a side of said package substrate opposite to said plurality of said singulated stacked die assemblies; and singulating said package substrate.

2. The method of claim 1, wherein said positioning comprises pick and placing.

3. The method of claim 1, wherein said positioning comprises using a thermo-compression bond head at a force less than or equal to 1 N, and a temperature less than or equal to 100° C., wherein said thermo-compression bond head includes a compliant material thereon.

4. The method of claim 1, wherein said bondable bottomside features comprise protruding TSV tips.

5. The method of claim 1, wherein said bondable bottomside features comprise pillars coupled to said contactable TSVs.

6. The method of claim 1, wherein said curable bonding adhesive layer comprises a bi-layer bonding adhesive having a more compliant top adhesive layer on a less compliant bottom adhesive layer.

7. The method of claim 1, wherein said bonding comprises thermo compression (TC) bonding.

8. The method of claim 1, wherein said debonding comprises heat release, UV release or solvent release.

9. The method of claim 1, wherein said plurality of second IC die comprise a plurality of singulated second IC die, further comprising adding a mold material between said plurality of singulated second IC die to form a molded wafer before said debonding.

10. The method of claim 1, wherein said plurality of TSV die comprise a plurality of singulated TSV die and said plurality of second IC die comprise a plurality of singulated second IC die.

11. The method of claim 1, wherein said plurality of TSV die comprise a plurality of singulated TSV die and said plurality of second IC die comprise a wafer that includes said plurality of second IC die.

12. The method of claim 1, wherein said plurality of TSV die comprise a TSV wafer and said plurality of second IC die comprise a plurality of singulated second IC die.

13. The method of claim 1, further comprising attaching a plurality of said singulated stacked die assemblies to a package substrate, attaching solder balls to said package substrate, and singulating said package substrate after said attaching.

14. The method of claim 1, further comprising adding an underfill layer between said plurality of said singulated stacked die assemblies and said package substrate before said attaching of said plurality of said singulated stacked die assemblies to said package substrate.

15. The method of claim 1, wherein an area of said plurality of second IC die is greater than an area of said plurality of TSV die.

16. The method of claim 1, further comprising adding an underfill layer between said plurality of second IC die and said plurality of TSV die before said bonding.

17. A method of manufacturing through substrate via (TSV) die assembly, comprising:
pick and placing a plurality of singulated TSV die with their topside facing down onto a curable bonding adhesive layer on a carrier, said plurality of singulated TSV die including contactable TSVs that include protruding TSV tips protruding from its a bottomside of at least two singulated TSV dies;
curing said curable bonding adhesive layer after said positioning;
bonding a plurality of second IC die each having a plurality of second bonding features onto said plurality of singulated TSV die to form a plurality of stacked die assemblies on said carrier;
debonding after said bonding to separate said carrier from said plurality of stacked die assemblies;
singulating said plurality of stacked die assemblies to form a plurality of singulated stacked die assemblies;
attaching said plurality of said singulated stacked die assemblies to a package substrate;
forming a mold layer on said package substrate lateral to said plurality of said singulated stacked die assemblies;
forming through mold vias including electrically conductive features lateral to said plurality of said singulated stacked die assemblies;
attaching solder balls on a side of said package substrate opposite to said plurality of said singulated stacked die assemblies; and
singulating said package substrate.

* * * * *